(12) United States Patent
Baraszu et al.

(10) Patent No.: US 9,211,802 B2
(45) Date of Patent: Dec. 15, 2015

(54) SYSTEMS AND METHODS FOR DETECTING A WEAK SUBDIVISION IN A BATTERY SYSTEM

(71) Applicant: GM GLOBAL TECHNOLOGY OPERATIONS LLC, Detroit, MI (US)

(72) Inventors: Robert C. Baraszu, Dearborn, MI (US); Kurt M. Johnson, Brighton, MI (US); Damon R. Frisch, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 480 days.

(21) Appl. No.: 13/715,656

(22) Filed: Dec. 14, 2012

(65) Prior Publication Data

US 2014/0167776 A1    Jun. 19, 2014

(51) Int. Cl.
| | |
|---|---|
| *G01N 27/416* | (2006.01) |
| *B60L 11/18* | (2006.01) |
| *G01R 31/36* | (2006.01) |
| *H01M 10/48* | (2006.01) |
| *H01M 10/42* | (2006.01) |

(52) U.S. Cl.
CPC ......... *B60L 11/1851* (2013.01); *G01R 31/3658* (2013.01); *H01M 10/4207* (2013.01); *H01M 10/482* (2013.01)

(58) Field of Classification Search
USPC ....................................................... 324/434
See application file for complete search history.

(56) References Cited

U.S. PATENT DOCUMENTS

| | | | |
|---|---|---|---|
| 2008/0164849 A1* | 7/2008 | Ciaramitaro ................... | 320/151 |
| 2009/0023053 A1* | 1/2009 | Berdichevsky et al. ........ | 429/61 |
| 2009/0218989 A1* | 9/2009 | Davis ............................ | 320/136 |

\* cited by examiner

*Primary Examiner* — Samuel Berhanu
(74) *Attorney, Agent, or Firm* — Phillips Ryther & Winchester; John P. Davis

(57) ABSTRACT

System and methods for identifying a weak subdivision in a battery system are presented. In certain embodiments, a system may include a battery pack that includes multiple subdivisions. A measurement system may be configured to determine multiple subdivision electrical parameters associated with the subdivisions. A battery control system may identify a weakest subdivision based one on or more calculated derivative ratios of a subdivision electrical parameter associated with one subdivision of the battery pack relative to a subdivision electrical parameter associated with another subdivision.

19 Claims, 3 Drawing Sheets

SYSTEMS AND METHODS FOR DETECTING A WEAK SUBDIVISION IN A BATTERY SYSTEM

TECHNICAL FIELD

This disclosure relates to systems and methods for protecting against over-discharge of a battery system. More specifically, the systems and methods of the present disclosure relate to monitoring individual subdivisions of a battery system, identifying weak subdivisions of the battery system, and implementing controls to prevent over-discharge of individual subdivisions of the battery system.

BACKGROUND

Passenger vehicles often include electric batteries for operating features of a vehicle's electrical and drivetrain systems. For example, vehicles commonly include a 12V lead-acid automotive battery configured to supply electric energy to vehicle starter systems (e.g., a starter motor), lighting systems, and/or ignition systems. In electric, fuel cell ("FC"), and/or hybrid vehicles, a high voltage ("HV") battery system (e.g., a 360V HV battery system) may be used to power electric drivetrain components of the vehicle (e.g., electric drive motors and the like). For example, an HV rechargeable energy storage system ("RESS") included in a vehicle may be used to power electric drivetrain components of the vehicle.

In certain designs, battery systems included in a vehicle may include one or more subdivisions or sections. For example, a vehicle battery system may include a battery pack that comprises one or more subdivisions of battery cells. Battery subdivisions may be replaced and/or added in a battery pack, resulting in differences in capacities, state of charge, discharge rates, impedances, and/or voltages between the new battery subdivisions and the existing battery subdivisions. Similarly, a battery cell may be replaced and/or added in a battery subdivision, resulting in differences in capacities, state of charge, discharge rates, impedances, and/or voltages between the new battery cell and the existing battery cells.

Battery discharge may terminate when at least one subdivision of the battery is depleted or at a threshold established by a battery control system. The threshold for terminating further discharge may be based upon monitoring the voltage or other parameters of the battery as a whole. Failure to restrict further discharge of the battery below an over-depletion threshold may result in battery system inefficiencies, degradation, permanent damage and/or a shortened usable lifespan.

SUMMARY

A battery system according to various embodiments of the present disclosure may include a plurality of subdivisions, such as battery cells or sub-packs. Over extended periods of use, different battery subdivisions may develop differences in capacities, states of charge, discharge rates, impedances, and/or voltages. Consistent with embodiments disclosed herein, a system for protecting against over discharge of a battery system and/or for identifying a weak subdivision in the battery system may include a battery pack comprising a multiple of subdivisions. In certain embodiments, the subdivisions may be individually replaceable.

A measurement system included in the system may be coupled to the battery pack and be configured to determine multiple subdivision electrical parameters (e.g., voltages associated with a subdivision). Each subdivision electrical parameter may be associated with one the battery system subdivisions. A battery control system may be communicatively coupled to the measurement system. The battery control system may be configured to identify a subdivision satisfying a criterion based on one or more first calculated derivative ratios. In certain embodiments, the criterion may be a subdivision that is a weak or weakest subdivision in the battery pack. The one or more first calculated derivative ratios may be derivative ratios of a subdivision electrical parameter associated with one subdivision relative to a subdivision electrical parameter associated with another subdivision in the battery pack.

In certain embodiments, the battery control system may be further configured to identify the subdivision satisfying the criterion based on one or more second calculated derivative ratios. The one or more second calculated derivative ratios may be derivative ratios of a subdivision electrical parameter associated with at least one subdivision of the battery pack relative to a pack electrical parameter (e.g., an average of the voltages of the subdivisions included in the battery back). When the system identifies a weak or weakest subdivision, battery control parameters may be generated based on the identified subdivision that may be utilized in various battery operations including, for example, battery balancing and/or discharging operations.

In further embodiments, a method for protecting against over discharge of a battery system and/or for identifying a weak subdivision in the battery system may include determining multiple subdivision electrical parameters (e.g., subdivision voltages) associated with a subdivision included in a battery pack that includes multiple subdivisions. Based on the determined subdivision electrical parameters, one or more first derivative ratios may be calculated. The one or more first derivative ratios may be derivative ratios of a subdivision electrical parameter associated with one subdivision of relative to a subdivision electrical parameter associated with another subdivision of the battery pack.

Based on the first derivative ratios, a subdivision satisfying a criterion may be identified. In certain embodiments, the criterion may be a subdivision that is a weak or weakest subdivision in the battery pack. In certain embodiments, one or more second derivative ratios may also be calculated. The one or more second calculated derivative ratios may be derivative ratios of a subdivision electrical parameter associated with at least one subdivision of the battery pack relative to a pack electrical parameter (e.g., an average of the voltages of the subdivisions included in the battery back). When the system identifies a weak or weakest subdivision, battery control parameters may be generated based on the identified subdivision that may be utilized in various battery operations including, for example, battery balancing and/or discharging operations.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
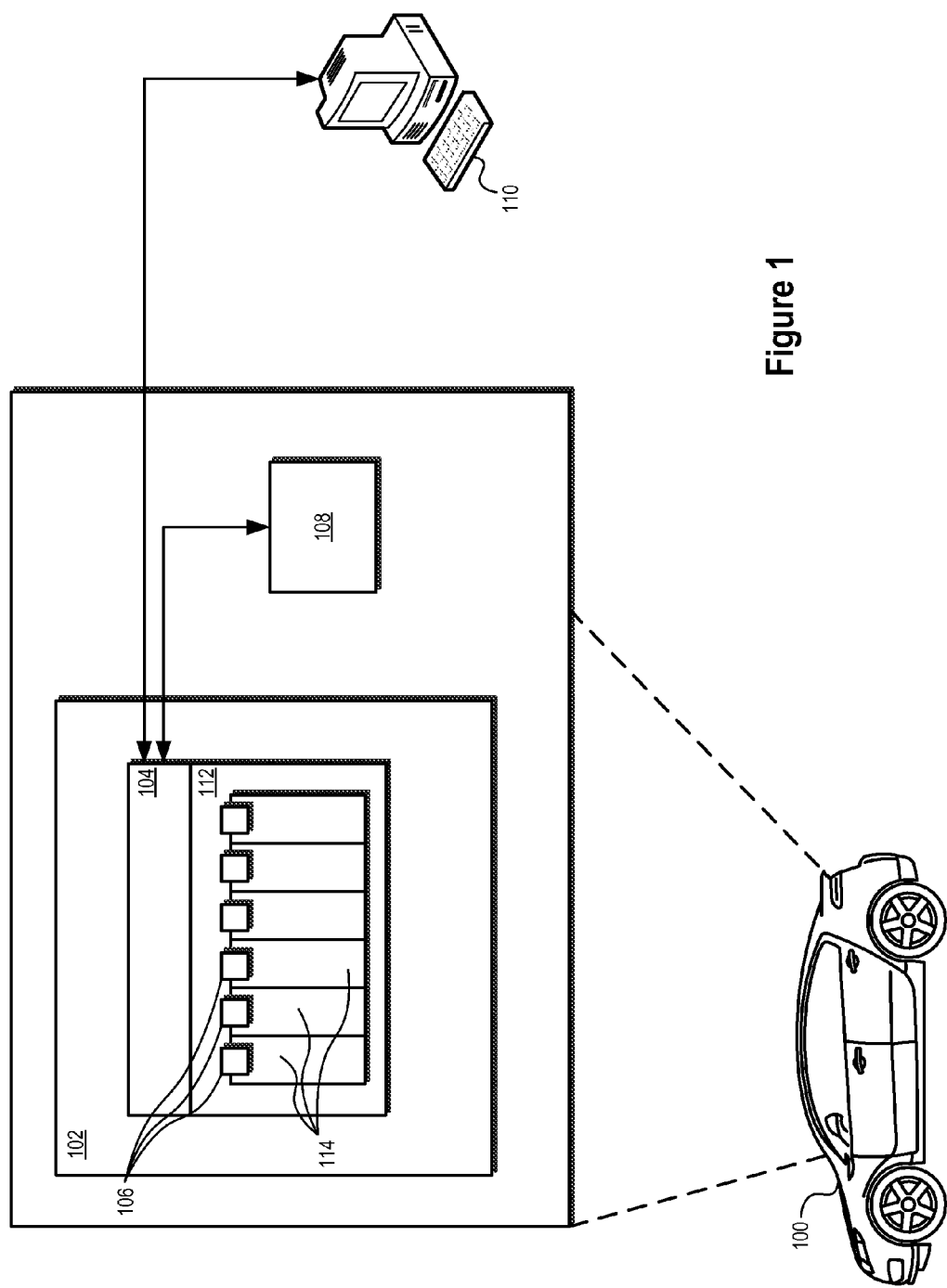
FIG. 1 illustrates an exemplary system for monitoring a battery system in a vehicle consistent with embodiments disclosed herein.

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Battery packs for hybrid and purely electric vehicles may include a plurality of subdivisions. For example, a vehicle battery system may include a battery pack that comprises one or more sub-packs or battery cells. The term subdivision, as used herein, may refer to either a sub-pack or a battery cell, or to a plurality of sub-packs or battery cells that together constitute a battery pack.

A battery having a plurality of subdivisions may provide efficiencies in packaging, manufacturability, and serviceability. In battery packs comprising multiple subdivisions, each subdivision may be individually replaceable. Individual subdivisions may fail or require replacement for a variety of reasons. In a battery system in which individual subdivisions are not individually replaceable, when one or more subdivisions fails or requires replacement, it may be necessary to replace the entire battery. The cost of replacing the entire battery may exceed the cost of replacing only one or more subdivisions of the battery. Accordingly, certain cost savings may be realized where a problem with a battery may be remedied by replacing only a single subdivision rather than replacing the entire battery.

As a result of replacement of one or more subdivisions, variations among subdivisions in a battery at the time of manufacture, or other issues, individual subdivisions may exhibit different electrical characteristics. Such characteristics may include differences in energy storage capacity, voltage, current, impedance, and the like. For example, in a circumstance in which a subdivision is replaced in a battery after a period of use, the newly replaced subdivision may have greater capacity than older subdivisions, whose capacity may have diminished over time and as a result of use.

A control system may monitor the condition of a battery while in use in order to prevent over-discharge of the battery and/or over-discharge of one or more individual subdivisions. Over-discharge of a battery may result in permanent damage to the battery and, accordingly, mitigating and/or preventing over-discharge of a battery is desirable. Further, given that individual subdivisions in a battery may exhibit differences in capacity, some subdivisions may become over-discharged before other sections are over-discharged and even before the battery as a whole is over-discharged. Individual monitoring and protection against over-discharge of individual subdivisions may be of greater concern after one or more subdivisions in a battery are replaced because the newly replaced subdivision may be able to store greater amounts of electrical energy, and thus, other older and/or weaker subdivisions may become over-depleted before the newly replaced subdivision.

The systems and methods disclosed herein may detect a battery subdivision satisfying certain criteria (e.g., the lowest estimated capacity subdivision, highest estimated electrical resistance, etc.) within a battery pack for the purpose of utilizing that subdivision's electrical characteristics to estimate battery control parameters. In certain embodiments, a weakest subdivision of the battery system may be detected. According to various embodiments, the weakest subdivision may refer to the subdivision having the lowest electrical storage capacity, the highest electrical resistance, or any other characteristic depending on the battery chemistry indicating the subdivision is the weakest. In some instances, the subdivision having the highest electrical resistance is also the cell having the lowest capacity, while in other cases this relation does not hold. Embodiments that identify the weakest subdivision within a battery and utilize the electrical characteristics of the weakest subdivision to estimate battery control parameters may consequently protect weak cells from over-discharge and resulting damage.

In certain embodiments, the systems and methods disclosed herein may measure electrical parameters associated with individual subdivisions. Monitoring may occur while the battery is charging (e.g., is plugged into a power source) or while the battery is discharging (e.g., electrical energy is being drawn from the battery to drive an electrical vehicle). As discussed above, certain embodiments may identify a subdivision satisfying a criterion (e.g., a weak subdivision) in the battery from various measured electric parameters (i.e., subdivision electrical parameters) and utilize the identified weak subdivision in estimating battery control parameters (e.g., control parameters utilized in battery balancing operations).

FIG. 1 illustrates an exemplary system for monitoring a battery system 102 in a vehicle 100 consistent with embodiments disclosed herein. The vehicle 100 may be a motor vehicle, a marine vehicle, an aircraft, and/or any other type of vehicle, and may include an internal combustion engine ("ICE") drivetrain, an electric motor drivetrain, a hybrid engine drivetrain, an FC drivetrain, and/or any other type of drivetrain suitable for incorporating the systems and methods disclosed herein. The vehicle 100 may include a battery system 102 that, in certain embodiments, may be an HV battery system. The HV battery system may be used to power electric drivetrain components (e.g., as in an electric, hybrid, or FC power system). In further embodiments, the battery system 102 may be a low voltage battery (e.g., a lead-acid 12V automotive battery) and may be configured to supply electric energy to a variety of vehicle 100 systems including, for example, vehicle starter systems (e.g., a starter motor), lighting systems, ignition systems, and/or the like.

The battery system 102 may include a battery control system 104. The battery control system 104 may be configured to monitor and control certain operations of the battery system 102. For example, the battery control system 104 may be configured to monitor and control charging and discharging operations of the battery system 102. In certain embodiments, the battery control system 104 may be communicatively coupled with one or more sensors 106 (e.g., voltage sensors, current sensors, and/or the like, etc.) and/or other systems configured to enable the battery control system 104 to monitor and control operations of the battery system 102. For example, sensors 106 may provide battery control system 104 with information used to estimate a state of charge, estimate a resistance, measure a current, and/or measure voltage of the battery system 102 and/or its constituent components. The battery control system 104 may further be configured to provide information to and/or receive information from other systems included in the vehicle 100. For example, the battery control system 104 may be communicatively coupled with an internal vehicle computer system 108 and/or an external computer system 110 (e.g., via a wireless telecommunications system or the like). In certain embodiments, the battery control system 104 may be configured, at least in part, to provide information regarding the battery system 102 to a user of the vehicle 100, vehicle computer system 108, and/or external computer system 110. Such information may include, for example, battery state of charge information, battery operating time information, battery operating temperature information, and/or any other information regarding the battery system 102.

The battery system 102 may include one or more battery packs 112 suitably sized to provide electrical power to the vehicle 100. Each battery pack 112 may include one or more subdivisions 114. The subdivisions 114 may comprise sub-packs, each of which may comprise one or more battery cells utilizing any suitable battery technology or combination thereof. Suitable battery technologies may include, for example, lead-acid, nickel-metal hydride ("NiMH"), lithium-ion ("Li-Ion"), Li-Ion polymer, lithium-air, nickel-cadmium ("NiCad"), valve-regulated lead-acid ("VRLA") including absorbed glass mat ("AGM"), nickel-zinc ("NiZn"), molten salt (e.g., a ZEBRA battery), and/or other suitable battery technologies.

Each subdivision 114 may be associated with a sensor 106 configured to measure one or more electrical parameters (e.g., voltage, current, impedance, state of charge, etc.) associated with each battery subdivision 114. Although FIG. 1 illustrates separate sensors 106 associated with each battery subdivision 114, in some embodiments a sensor configured to measure various electrical parameters associated with a plurality of subdivisions 114 may also be utilized. The electrical parameters (e.g., subdivision electrical parameters) measured by sensor 106 may be provided to battery control system 104. Using the electrical parameters, battery control system 104 and/or any other suitable system may coordinate the operation of battery system 102 (e.g., charging operations, discharging operations, balancing operations, etc.).

In certain embodiments, one or more electrical parameters may be provided by battery control system 104 and/or one or more sensors 106 to vehicle computer system 108, and/or external computer system 110. For example, an indication regarding differences in one or more electrical parameters between various subdivisions 114 may be provided. Such differences may include, for example, variations in the voltage of each subdivision 114, differences in the amount of current that can be sourced from each subdivision 114, differences in the estimated capacity of each subdivision 114, and/or the like. With this information, a user of the vehicle 100 and/or external computer system 110 may identify a weak subdivision of the subdivisions 114, diagnose potential problems with battery system 102, and/or take protective action to mitigate the potential for damage to battery system 102 (e.g., by performing battery balancing operations or setting battery discharge thresholds).

Figure 2:
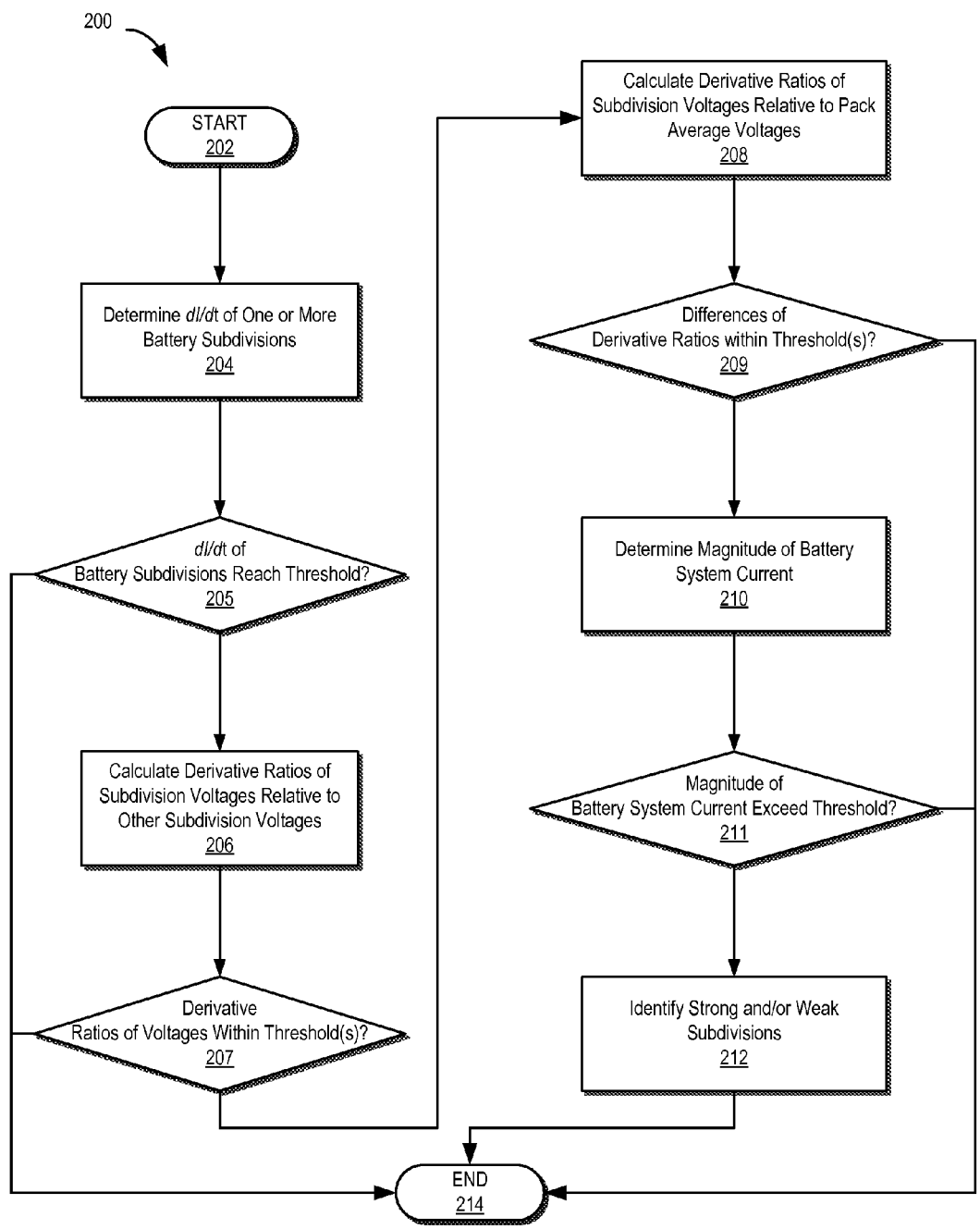
FIG. 2 illustrates a flow chart of an example of a method for identifying a weak subdivision in a battery system consistent with embodiments disclosed herein.

FIG. 2 illustrates a flow chart of an example of a method 200 for identifying a weak subdivision in a battery system consistent with embodiments disclosed herein. In certain embodiments, the illustrated method 200 may be performed using, at least in part, a battery control system, an internal vehicle computer system, an external computer system, and/or one or more sensors as disclosed herein. In further embodiments, any other suitable system or systems may be utilized.

At 202, the method may be initiated. In certain embodiments, method 200 may be initiated upon startup of any of the vehicle, a battery control system, a vehicle computer, and/or a battery system. In other embodiments, method 200 may be performed when the vehicle and/or battery system are not in use. In further embodiments, method 200 may be performed upon the installation of a new battery subdivision and/or the replacement of an old battery subdivision. Method 200 and/or its constituent steps may also be performed at any other suitable time.

At 204, a change in current over time (i.e., dI/dt) supplied by one or more battery subdivisions of a battery system may be determined (e.g., measured and/or estimated). In certain embodiments, the change in current over time supplied by the one or more battery subdivisions may be determined based on information provided by one or more sensors associated with the one or more battery subdivisions. At 205, when the change in current over time supplied by the one or more battery subdivisions reaches a particular threshold (e.g., exceeds the threshold), the method 200 may proceed to 206. Otherwise, the method 200 may proceed to terminate at 214. In certain embodiments, the threshold may be associated with at change in current over time occurring when least one of the battery subdivisions is a weak subdivision. In certain embodiments, a determination that the change in current over time supplied by the one or more battery subdivisions has reached a particular threshold may indicate, at least in part, that the one or more battery subdivisions include at least one weak subdivision.

In certain embodiments, the change in current over time supplied by the one or more battery subdivisions may provide an approximation of the internal resistance of the battery over relatively short calculation times. A higher change in current over time may indicate that the systems and methods disclosed herein may more accurately detect a weak subdivision. In certain embodiments, both an absolute current threshold (e.g., 100 A) and a derivative current threshold (e.g., 150 A/s) of the one or more subdivisions may be utilized to determine whether the method 200 should proceed to 206.

At 206, derivative ratios of subdivision voltages relative to other subdivision voltages may be calculated. For example, in an exemplary battery system including three subdivisions (i.e., subdivision 1, subdivision 2, and subdivision 3), utilized throughout this disclosure for purposes of illustration, a derivative of voltage may be calculated for each subdivision using Equation 1:

$$d_{subdivision1} = \frac{dV_{subdivision1}}{dt}$$

$$d_{subdivision2} = \frac{dV_{subdivision2}}{dt}$$

$$d_{subdivision3} = \frac{dV_{subdivision3}}{dt}$$

Equation 1

Derivative ratios of average subdivision voltages corresponding to $$\frac{d_{subdivision1}}{d_{subdivision2}},$$

$$\frac{d_{subdivision1}}{d_{subdivision3}},$$

and $$\frac{d_{subdivision2}}{d_{subdivision3}}$$

may be calculated, where $$\frac{d_{subdivision1}}{d_{subdivision2}}$$

is the change of voltage of subdivision1 over the change of voltage of subdivision 2, $$\frac{d_{subdivision1}}{d_{subdivision3}}$$

is the change of voltage of subdivision1 over the change of voltage of subdivision 3, and $$\frac{d_{subdivision2}}{d_{subdivision3}}$$

is the change of voltage of subdivision 2 over the change of voltage of subdivision 3. In certain embodiments, the calculated derivative ratios of subdivision voltages relative to other subdivision voltages may be utilized to estimate a relative resistance of one subdivision with respect to another subdivision and/or capacity of one subdivision with respect to another subdivision.

At 207, a determination may be made whether the calculated derivative ratios of average subdivision voltages fall within one or more thresholds. For example, in the exemplary battery system including three subdivisions, a determination may be made whether the calculated derivative ratios of average subdivision voltages fall between a minimum threshold and a maximum threshold as expressed in the conditions below in Equation 2.

$$\frac{d_{subdivision1}}{d_{subdivision2}} > \text{minimum threshold} \qquad \text{Equation 2}$$

and $$\frac{d_{subdivision1}}{d_{subdivision3}} > \text{minimum threshold}$$

and $$\frac{d_{subdivision2}}{d_{subdivision3}} > \text{minimum threshold}$$

and $$\frac{d_{subdivision1}}{d_{subdivision2}} < \text{maximum threshold}$$

and

-continued $$\frac{d_{subdivision1}}{d_{subdivision3}} < \text{maximum threshold}$$

and $$\frac{d_{subdivision2}}{d_{subdivision3}} < \text{maximum threshold}$$

In certain embodiments, the maximum threshold may be greater than 1 (e.g., 1.25) and the minimum threshold may be less than 1 (e.g., 0.75). Utilizing such a threshold determination may reduce errors in identifying a weak section attributable to inaccuracies in signal acquisition and instability in calculating certain derivatives. If the calculated derivative ratios of average subdivision voltages fall within the threshold conditions, the method 200 may proceed to 208. Otherwise, the method 200 may terminate at 214.

At 208, derivative ratios of subdivision voltages relative to the total average voltages of all subdivisions in the battery system (e.g., a pack electrical parameter) may be calculated. At 209, a determination may be made whether the absolute values of differences between the calculated derivative ratios of average subdivision voltages as well the absolute values of differences between the calculated derivative ratios of subdivision voltages relative to the total average voltages of all subdivisions in the battery system fall within certain thresholds. For example, in the exemplary battery system including three subdivisions, a determination may be made whether conditions expressed below in Equation 3 are met:

$$\left|\frac{d_{subdivision1}}{d_{subdivision2}} - \frac{d_{subdivision1}}{d_{subdivision3}}\right| > \text{minimum } \Delta \qquad \text{Equation 3}$$

or $$\left|\frac{d_{subdivision1}}{d_{subdivision2}} - \frac{d_{subdivision2}}{d_{subdivision3}}\right| > \text{minimum } \Delta$$

or $$\left|\frac{d_{subdivision1}}{d_{subdivision3}} - \frac{d_{subdivision2}}{d_{subdivision3}}\right| > \text{minimum } \Delta$$

and $$\left|\frac{d_{subdivision1}}{d_{AvgTot}} - \frac{d_{subdivision2}}{d_{AvgTot}}\right| > \text{minimum } \Delta$$

or $$\left|\frac{d_{subdivision1}}{d_{AvgTot}} - \frac{d_{subdivision3}}{d_{AvgTot}}\right| > \text{minimum } \Delta$$

or $$\left|\frac{d_{subdivision2}}{d_{AvgTot}} - \frac{d_{subdivision3}}{d_{AvgTot}}\right| > \text{minimum } \Delta$$

In certain embodiments, by determining that at least one of the derivative ratios calculated at 206 and at least one of the derivative ratios calculated at 208 have at least a threshold separation of a minimum value, a determination may be made that a weak section can be identified by method 200 accurately. In certain embodiments, the value for minimum Δ may be 0.075, although other suitable values are also contemplated. If the above conditions are met, the method 200 may proceed to 210. Otherwise, the method 200 may terminate at 214.

At 210, a magnitude of the current of the battery system may be determined. At 211, if the magnitude of the current exceeds a minimum threshold (e.g., 100 A), the method 200 may proceed to 212. Otherwise, the method 200 may terminate at 214. In certain embodiments, ensuring the magnitude of the current exceeds the minimum threshold may help ensure a weak section is identified by method 200 accurately.

Based on the calculated derivative ratios and/or estimated relative resistances or capacities derived from the same, at 212, one or more strong and/or weak subdivisions may be identified. In certain embodiments, one or more strong and/or weak subdivisions may be identified utilizing the calculated ratios in conjunction with a lookup table. In the exemplary battery system including three subdivisions, one or more strong and/or weak subdivisions may be determined based on the calculated ratios according to Table 1, as shown below. In further embodiments, any other suitable method for identifying one or more strong and/or weak subdivisions in a battery system utilizing the calculated ratios may be used.

TABLE 1

Exemplary Derivative Ratios of Subdivision Voltages Relative to Other Subdivision Voltages In a Three Subdivision Battery System

| | Strong 1 Weak 2,3 | Strong 2 Weak 1,3 | Strong 3 Weak 1,2 | Weak 1 Strong 2,3 | Weak 2 Strong 1,3 | Weak 3 Strong 1,2 |
|---|---|---|---|---|---|---|
| $\dfrac{d_{subdivision1}}{d_{subdivision2}}$ | <1 | >1 | ~=1 | >1 | <1 | ~=1 |
| $\dfrac{d_{subdivision1}}{d_{subdivision3}}$ | <1 | ~=1 | >1 | >1 | ~=1 | <1 |
| $\dfrac{d_{subdivision2}}{d_{subdivision3}}$ | ~=1 | <1 | >1 | ~=1 | >1 | <1 |

In certain circumstances, a single weak subdivision of a plurality of subdivisions included in a battery system may be identified based on the calculated derivative ratios and/or estimated relative resistances or capacities. For example, as shown in Table 1, in the exemplary three subdivision battery system, if $$\frac{d_{subdivision1}}{d_{subdivision2}} > 1,$$

$$\frac{d_{subdivision1}}{d_{subdivision3}} > 1,$$

and $$\frac{d_{subdivision2}}{d_{subdivision3}} \sim = 1,$$

subdivision1 may be identified as a weak subdivision. If $$\frac{d_{subdivision1}}{d_{subdivision2}} < 1,$$

$$\frac{d_{subdivision1}}{d_{subdivision3}} \sim = 1,$$

and $$\frac{d_{subdivision2}}{d_{subdivision3}} > 1,$$

subdivision 2 may be identified as a weak subdivision.

Finally, if $$\frac{d_{subdivision1}}{d_{subdivision2}} \sim = 1,$$

$$\frac{d_{subdivision1}}{d_{subdivision3}} < 1,$$

and $$\frac{d_{subdivision2}}{d_{subdivision3}} < 1,$$

subdivision 3 may be identified as a weak subdivision. In certain embodiments, if a single subdivision of a plurality of subdivisions is identified as a weak subdivision, the identified subdivision may be the weakest subdivision and be utilized estimate battery control parameters (e.g., parameters used in battery balancing operations or the like).

In further circumstances, multiple weak subdivisions may be identified based on the calculated derivative ratios and/or estimated relative resistances. For example, as shown in Table 1, in the exemplary three subdivision battery system, if $$\frac{d_{subdivision1}}{d_{subdivision2}} < 1,$$

$$\frac{d_{subdivision1}}{d_{subdivision3}} < 1,$$

and $$\frac{d_{subdivision2}}{d_{subdivision3}} \sim = 1,$$

subdivision1 may be identified as a strong subdivision and subdivision 2 and subdivision 3 may be identified as weak subdivisions. If $$\frac{d_{subdivision1}}{d_{subdivision2}} > 1,$$

$$\frac{d_{subdivision1}}{d_{subdivision3}} \sim = 1,$$

and $$\frac{d_{subdivision2}}{d_{subdivision3}} < 1,$$

subdivision 2 may be identified as a strong subdivision and subdivision1 and subdivision 3 may be identified as weak subdivisions. Finally, if $$\frac{d_{subdivision1}}{d_{subdivision2}} \sim = 1,$$

$$\frac{d_{subdivision1}}{d_{subdivision3}} > 1,$$

and $$\frac{d_{subdivision2}}{d_{subdivision3}} > 1,$$

subdivision 3 may be identified as a strong subdivision and subdivision1 and subdivision 2 may be identified as weaker subdivisions.

In circumstances where multiple weak subdivisions are identified based on the calculated derivative ratios and/or estimated relative resistances or capacities, derivative ratios of subdivision voltages relative to the total average voltages of all subdivisions in the battery system (e.g., a pack electrical parameter) may be utilized to identify a weakest subdivision of the identified weak subdivisions. In certain embodiments, a lookup table may be utilized to identify a weakest subdivision of the identified weak subdivisions using the derivative ratios of subdivision voltages relative to the total average voltages of all subdivisions. For example, in the exemplary battery system including three subdivisions, a weakest subdivision of multiple identified weak subdivisions may be determined according to Table 2, as shown below. In further embodiments, any other suitable method for identifying one or more strong and/or weak subdivisions in a battery system may be utilized.

TABLE 2

Exemplary Derivative Ratios of Subdivision Voltages Relative to Total Average Voltages of All Subdivisions in a Three Subdivision Battery System

|  | Strong 1<br>Weak 2, 3 | Strong 2<br>Weak 1, 3 | Strong 3<br>Weak 1, 2 |
|---|---|---|---|
| $\frac{d_{subdivision1}}{d_{AvgTot}}$ | N/A | $> \frac{d_{subdivision3}}{d_{AvgTot}}$<br>Weakest 1 | $> \frac{d_{subdivision2}}{d_{AvgTot}}$<br>Weakest 1 |
| $\frac{d_{subdivision2}}{d_{AvgTot}}$ | $> \frac{d_{subdivision3}}{d_{AvgTot}}$<br>Weakest 2 | N/A | $> \frac{d_{subdivision1}}{d_{AvgTot}}$<br>Weakest 2 |
| $\frac{d_{subdivision3}}{d_{AvgTot}}$ | $> \frac{d_{subdivision2}}{d_{AvgTot}}$<br>Weakest 3 | $> \frac{d_{subdivision1}}{d_{AvgTot}}$<br>Weakest 3 | N/A |

As shown in Table 2, in the exemplary three subdivision battery system, if subdivision1 is identified as strong and subdivision 2 and subdivision 3 are identified as weak subdivisions, when $$\frac{d_{subdivision2}}{d_{AvgTot}} > \frac{d_{subdivision3}}{d_{AvgTot}},$$

subdivision 2 is identified as the weakest subdivision, and when $$\frac{d_{subdivision3}}{d_{AvgTot}} > \frac{d_{subdivision2}}{d_{AvgTot}},$$

subdivision 3 is identified as the weakest subdivision. Similarly, if subdivision 2 is identified as strong and subdivision1 and subdivision 3 are identified as weak subdivisions, when $$\frac{d_{subdivision1}}{d_{AvgTot}} > \frac{d_{subdivision3}}{d_{AvgTot}},$$

subdivision1 is identified as the weakest subdivision, and when $$\frac{d_{subdivision3}}{d_{AvgTot}} > \frac{d_{subdivision1}}{d_{AvgTot}},$$

subdivision 3 is identified as the weakest subdivision. Finally, if subdivision 3 is identified as strong and subdivision1 and subdivision 2 are identified as weak subdivisions, when $$\frac{d_{subdivision1}}{d_{AvgTot}} > \frac{d_{subdivision2}}{d_{AvgTot}},$$

subdivision1 is identified as the weakest subdivision, and when $$\frac{d_{subdivision2}}{d_{AvgTot}} > \frac{d_{subdivision1}}{d_{AvgTot}},$$

subdivision 2 is identified as the weakest subdivision. Once identified, parameters relating to the weakest subdivision may be utilized in estimating battery control parameters including, for example, control parameters utilized in battery discharging and/or balancing operations. After a weakest subdivision has been identified, the method 200 may terminate at 214.

In certain embodiments, method 200 may further incorporate a determination of pack uniformity. For example, the method 200 may include a determination that the relative strengths of subdivisions included in a battery system are relatively uniform. Based on this determination, a weak section may not need to be identified as battery control parameters (e.g., parameters utilized in battery discharging and/or balancing operations) under substantially uniform pack conditions may be based on average pack parameters.

Figure 3:
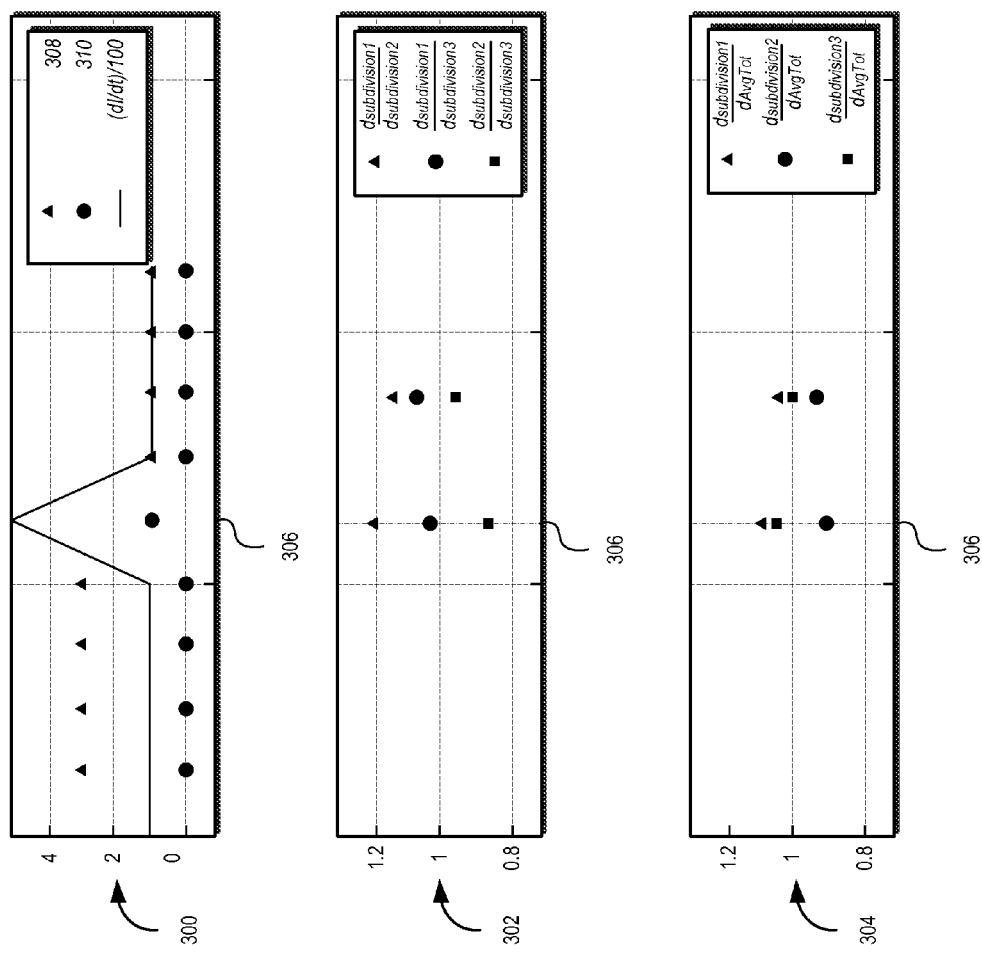
FIG. 3 includes graphs illustrating exemplary measurement parameters utilized in identifying weak subdivisions in a battery system consistent with embodiments disclosed herein.

FIG. 3 includes graphs 300-304 illustrating exemplary measurement parameters utilized in identifying weak subdivisions in a battery system consistent with embodiments disclosed herein. In certain embodiments, the exemplary measurement parameters illustrated in graphs 300-304 may be measured and/or estimated using, at least in part, a battery control system, an internal vehicle computer system, an external computer system, and/or one or more sensors as disclosed herein. Moreover, the exemplary measurement parameters illustrated in graphs 300-304 may be utilized in any of the methods disclosed herein, including the methods illustrated in and described in reference to FIG. 2.

Graph 300 illustrates current over time supplied by one or more battery subdivisions of an exemplary battery system as well as change in the current over time 308 (i.e., dI/dt). As discussed above, in certain embodiments, when a change in current over time supplied by the one or more battery subdivisions reaches a particular threshold (e.g., exceeds the threshold), a determination may be made that the one or more battery subdivisions include at least one weak battery subdivision. For example, as illustrated, when dI/dt exhibits a change at 306, an indication 310 may be asserted that the one or more battery subdivisions include at least one weak battery subdivision. This indication may be utilized by systems disclosed herein to initiate methods disclosed configured to identify a weak subdivision of a battery system.

Graph 302 illustrates calculated derivative ratios of average subdivision voltages relative to other subdivision voltages in an exemplary three subdivision battery system. In certain embodiments, the exemplary measurement parameters illustrated in graph 302 may be utilized in conjunction with the information included in Table 1 to identify one or more strong and/or weak subdivisions in a battery system. For example, as illustrated, at approximately 306 (e.g., approximately when 310 is asserted in graph 300), $$\frac{d_{subdivision1}}{d_{subdivision2}} > 1, \frac{d_{subdivision2}}{d_{subdivision3}} < 1, \text{ and } \frac{d_{subdivision1}}{d_{subdivision3}} \sim = 1.$$

Based on these parameters and the information included in Table 1, it may be determined that subdivision 2 is a strong subdivision and subdivision1 and subdivision 3 are weak subdivisions.

Graph 304 illustrates calculated derivative ratios of subdivision voltages relative to the average total voltages of all subdivisions in an exemplary three subdivision battery system. In certain embodiments, the exemplary measurement parameters illustrated in graph 302 may be utilized in conjunction with the information included in Table 2 to identify a weakest subdivision of multiple identified weak subdivisions in a battery system. For example, as illustrated, at approximately 306 (e.g., approximately when 310 is asserted in graph 300), $$\frac{d_{subdivision1}}{d_{AvgTot}} > \frac{d_{subdivision3}}{d_{AvgTot}}.$$

Based on these parameters and the information included in Tables 1 and 2, it may be determined that subdivision1 is the weakest subdivision, subdivision 3 is a weak subdivision, and subdivision 2 is a strong subdivision. Based on this determination, parameters may be determined associated with the weakest subdivision (e.g., an estimated state of charge) and utilized in estimating battery control parameters including, for example, control parameters utilized in battery discharging and/or balancing operations.

In certain embodiments, the systems and methods disclosed herein may be implemented, at least in part, using one or more computer systems. For example, certain features and functionality of the battery electronics, vehicle computer system, and/or external computer system may be implemented using a computer system. The systems and methods disclosed herein are not inherently related to any particular computer or other apparatus and may be implemented by a suitable combination of hardware, software, and/or firmware. Software implementations may include one or more computer programs comprising executable code/instructions that, when executed by a processor, may cause the processor to perform a method defined at least in part by the executable instructions. The computer program can be written in any form of programming language, including compiled or interpreted languages, and can be deployed in any form, including as a standalone program or as a module, component, subroutine, or other unit suitable for use in a computing environment. Further, a computer program can be deployed to be executed on one computer or on multiple computers at one site or distributed across multiple sites and interconnected by a communication network. Software embodiments may be implemented as a computer program product that comprises a non-transitory storage medium configured to store computer programs and instructions that, when executed by a processor, are configured to cause the processor to perform a method according to the instructions. In certain embodiments, the non-transitory storage medium may take any form capable of storing processor-readable instructions on a non-transitory storage medium. A non-transitory storage medium may be embodied by a compact disk, digital-video disk, a magnetic tape, a Bernoulli drive, a magnetic disk, a punch card, flash memory, integrated circuits, or any other non-transitory digital processing apparatus memory device.

Although the foregoing has been described in some detail for purposes of clarity, it will be apparent that certain changes and modifications may be made without departing from the principles thereof. For example, in certain embodiments, systems and methods for parameters utilized identifying a weak or weakest subdivision of a battery system disclosed herein may be utilized to estimate a resistance and/or a relative resistance and/or a state of charge and/or a relative state of charge of the weak or weakest subdivision in a battery system. Certain features of the embodiments disclosed herein may be configured and/or combined in any suitable configuration or combination. Additionally, certain systems and/or methods disclosed herein may be utilized in battery systems not included in a vehicle (e.g., a backup power battery system or the like). It is noted that there are many alternative ways of implementing both the processes and apparatuses described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A system comprising:
a battery pack comprising a plurality of subdivisions;
a measurement system configured to determine a plurality of subdivision electrical parameters, each subdivision electrical parameter of the plurality of subdivision electrical parameters being associated with one of the plurality of subdivisions;
a battery control system communicatively coupled to the measurement system, the battery control system configured to identify a subdivision satisfying a criterion based on one or more first calculated derivative ratios, the one or more first calculated derivative ratios comprising derivative ratios of a first subdivision electrical parameter associated with one subdivision of the plurality of subdivisions relative to a second subdivision electrical parameter associated with another subdivision of the plurality of subdivisions.

2. The system of claim 1, wherein the battery control system is further configured to identify a weak subdivision from among the plurality of subdivisions based on the criterion.

3. The system of claim 1, wherein the battery control system is further configured to identify the subdivision satisfying the criterion based on one or more second calculated derivative ratios, the one or more second calculated derivative ratios comprising derivative ratios of a subdivision electrical parameter of the plurality of subdivision electrical parameters associated with at least one subdivision of the plurality of subdivisions relative to a pack electrical parameter.

4. The system of claim 1, wherein the measurement system further comprises a plurality of voltage measurement sensors and each subdivision electrical parameter of the plurality of subdivision electrical parameters comprises a measured voltage of an associated subdivision of the plurality of subdivisions.

5. The system of claim 3, wherein the pack electrical parameter comprises an average of the voltages of the plurality of subdivisions.

6. The system of claim 1, wherein each of the plurality of subdivisions is individually replaceable, and wherein the battery pack comprises at least one replacement subdivision.

7. The system of claim 1, wherein each of the plurality of subdivisions comprises one or more battery cells.

8. The system of claim 1, wherein each of the plurality of subdivisions comprises one or more battery sub-packs, each one of the one more battery sub-packs comprising one or more battery cells.

9. The system of claim 1, wherein the battery control system configured to identify a subdivision satisfying the criterion based on a determination that at least one subdivision of the plurality of subdivisions is a weak subdivision relative to the other subdivisions.

10. A method of identifying a weak subdivision in a battery pack comprising a plurality of subdivisions, the method comprising:
measuring a plurality of subdivision electrical parameters, each subdivision electrical parameter of the plurality of subdivision electrical parameters being associated with one of the plurality of subdivisions of the battery pack;
calculating one or more first derivative ratios, the one or more first derivative ratios comprising derivative ratios of a first subdivision electrical parameter associated with one subdivision of the plurality of subdivisions relative to a second subdivision electrical parameter associated with another subdivision of the plurality of subdivisions; and
identifying a subdivision satisfying a criterion based on the one or more first derivative ratios; and
balancing the battery pack based on one or more first control parameters associated with the identified subdivision.

11. The method of claim 10, wherein identifying the subdivision satisfying the criterion comprises identifying a weak subdivision from among the plurality of subdivisions based on the criterion.

12. The method of claim 10 further comprising:
calculating one or more second derivative ratios, the one or more second derivative ratios comprising derivative ratios of a subdivision electrical parameter of the plurality of subdivision electrical parameters associated with at least one subdivision of the plurality of subdivisions relative to a pack electrical parameter.

13. The method of claim 10, wherein the each subdivision electrical parameter of the plurality of subdivision electrical parameters comprises a voltage associated with one of the plurality of subdivisions.

14. The method of claim 12, wherein the pack electrical parameter comprises an average of the voltages of the plurality of subdivisions.

15. The method of claim 10, wherein each of the plurality of subdivisions is individually replaceable, and wherein the battery pack comprises at least one replacement subdivision.

16. The method of claim 10, wherein each of the plurality of subdivisions comprises one or more battery cells.

17. The method of claim 10, wherein each of the plurality of subdivisions comprises one or more battery sub-packs, each one of the one more battery sub-packs comprising one or more battery cells.

18. The method of claim 10 further comprising determining that at least one of the plurality of subdivisions is a weak subdivision relative to the other subdivisions.

19. The method of claim 10 further comprising discharging the battery pack based on one or more second control parameters associated with the identified subdivision.

* * * * *